United States Patent [19]

Leyssens et al.

[11] Patent Number: 5,329,425
[45] Date of Patent: Jul. 12, 1994

[54] COOLING SYSTEM

[75] Inventors: Francois J. C. Leyssens, Mortsel; Hendrikus M. J. Rombouts, Zoersel, both of Belgium

[73] Assignee: Alcatel N.V., Amsterdam, Netherlands

[21] Appl. No.: 829,358

[22] Filed: Jan. 30, 1992

[30] Foreign Application Priority Data

Feb. 25, 1991 [EP] European Pat. Off. ........ 91200392.8

[51] Int. Cl.⁵ .............................................. H05K 7/20
[52] U.S. Cl. .................................. 361/701; 165/80.4; 165/104.33; 174/15.2; 361/802
[58] Field of Search ............................ 174/15.2; 211/41; 62/119, 524, 519, 418; 357/82; 165/80.4, 104.21, 104.33; 361/385–388, 415, 700, 701, 704, 707, 711, 720, 796, 802

[56] References Cited

U.S. PATENT DOCUMENTS

| | | | |
|---|---|---|---|
| 3,613,778 | 10/1971 | Feldman, Jr. | 361/385 |
| 3,700,028 | 10/1972 | Noren | 165/32 |
| 3,971,435 | 7/1976 | Peck | 361/385 |
| 4,019,098 | 4/1977 | McCready et al. | 361/385 |
| 4,120,021 | 10/1978 | Roush | 361/388 |
| 4,184,539 | 1/1980 | Rein | 165/80 |
| 4,315,300 | 2/1982 | Parmerlee | 361/382 |
| 4,366,526 | 12/1982 | Lijoi et al. | 361/385 |
| 4,503,483 | 3/1985 | Basiulus | 361/385 |
| 4,675,783 | 6/1987 | Murase et al. | 361/385 |
| 4,701,829 | 10/1987 | Bricaud et al. | 361/386 |
| 4,727,455 | 2/1988 | Neidig et al. | 361/385 |
| 4,793,405 | 12/1988 | Diggelmann et al. | 165/104 |
| 4,958,257 | 9/1990 | Wenke | 361/385 |
| 5,019,939 | 5/1991 | Reimer | 361/386 |
| 5,029,389 | 7/1991 | Tanzer | 165/104.21 |

FOREIGN PATENT DOCUMENTS 0231456  8/1987  European Pat. Off. .
91/10346  7/1991  PCT Int'l Appl. .

OTHER PUBLICATIONS

Kerjilian et al., "Heat-Pipe Cooled Stacked Electronic Wafer Package," IBM Technical Disclosure Bulletin, vol. 18, No. 12, May 1976.

Ingram et al., "Dendritic Wick for Heat Pipe Application", IBM Technical Disclosure Bulletin, vol. 14, No. 9, Feb. 1972.

Dunn et al., "Heat Pipes," Pergamon Press, 1976.

Tien, "Heat Pipes," from Handbook of Heat Transfer Applications. (no date).

Primary Examiner—Gerald P. Tolin
Attorney, Agent, or Firm—Spencer, Frank & Schneider

[57] ABSTRACT

A cooling system for a plurality of circuit boards, each circuit board having a substantially planar thermally conductive thermal sink having longitudinal sides and being in thermal contact with a plurality of electronic components dissipating heat, includes a heat exchanger for delivering heat to a cooling medium and a heat pipe for transferring heat from each thermal sink to the heat exchanger. The heat pipe includes at least one flat box-shaped heat pipe, at least a first part of the heat pipe being in thermal contact with the longitudinal sides of the thermal sinks of the circuit boards.

3 Claims, 3 Drawing Sheets

COOLING SYSTEM

BACKGROUND OF THE INVENTION

1. Field of the Invention.

The present invention relates to a cooling system for a plurality of circuit boards each having a substantially planar thermally conductive thermal sink having longitudinal sides and in thermal contact with a plurality of electronic components dissipating heat, in particular cooling system including a heat exchanger to deliver heat to a cooling medium and heat pipe means to transfer heat from said thermal sinks to said heat exchanger.

2. Background Information

Such a cooling system is already known from the non-published PCT patent application No PCT/EP89/01613 (F. Leyssens et al 11-4-1) first filed by Applicant on Dec. 28, 1989. Therein the heat pipe means comprises sets of heat conductive metal rails housing heat pipes. More particularly, two sets of first metal rails arranged in two parallel planes and housing first heat pipes make thermal contact with respective opposite longitudinal sides of the thermal sinks of the circuit boards. Two sets of second metal rails including second parallel heat pipes and mounted in a plane perpendicular to those containing the first metal rails makes thermal contact therewith. Finally, a third metal rail housing third heat pipes and mounted in a plane perpendicular to those containing the first and second metal rails makes thermal contact with the second rails and leads to the heat exchanger.

A drawback of this known cooling system is that the thermal resistance between the thermal sinks and the heat exchanger is still relatively high, especially due to the fact that the heat transfer between these elements does not take place directly via the heat pipes but through the intermediary of a plurality of metal rails which thermally link the thermal sinks, heat pipes and heat exchanger and which present a relatively high thermal resistance especially at their junctions.

SUMMARY OF THE INVENTION

An object of the present invention is to provide a cooling system of the above known type, but presenting a reduced thermal resistance.

According to the invention, this object is achieved due to the fact that the heat pipe means includes at least one flat box-shaped heat pipe of which at least one part is in thermal contact with the longitudinal sides of the thermal sinks of the circuit boards.

Heat from the thermal sinks is thus collected and transferred by a single flat box-shaped heat pipe, thus reducing the thermal resistance of the cooling system. Compared with the known system, the flat box-shaped heat pipe thus replaces the first and second heat pipes thermally coupled by metal rails.

Another characteristic feature of the present cooling system is that the longitudinal sides of the thermal sinks are located in grooves making thermal contact with the flat box-shaped heat pipe, Still another characteristic feature of the present cooling system is that it further includes a guide plate provided with the grooves and in thermal contact with the heat pipe.

The grooved guide plate thus collects heat from the thermal sinks and transfers it to the single flat box-shaped heat pipe and may be thermally coupled via a rail containing a heat pipe and leading to the heat exchanger compared with the above known system, the grooved guide plate thus replaces the first and second rails.

The cooling system according to the invention is also characterized in that the flat box-shaped heat pipe has another part substantially perpendicular to the one part and leading to the heat exchanger In this way the flat box-shaped heat pipe conveys the heat collected from the thermal sinks directly to the heat exchanger. Compared with the known system, there is no need to use third rails housing heat pipes.

BRIEF DESCRIPTION OF THE DRAWINGS

The above mentioned and other objects and features of the invention will become more apparent and the Invention itself will be best understood by referring to the following description of embodiments taken in conjunction with the accompanying drawings wherein.

DETAILED DESCRIPTION OF THE PREFERRED EMBODIMENTS

Figure 1:
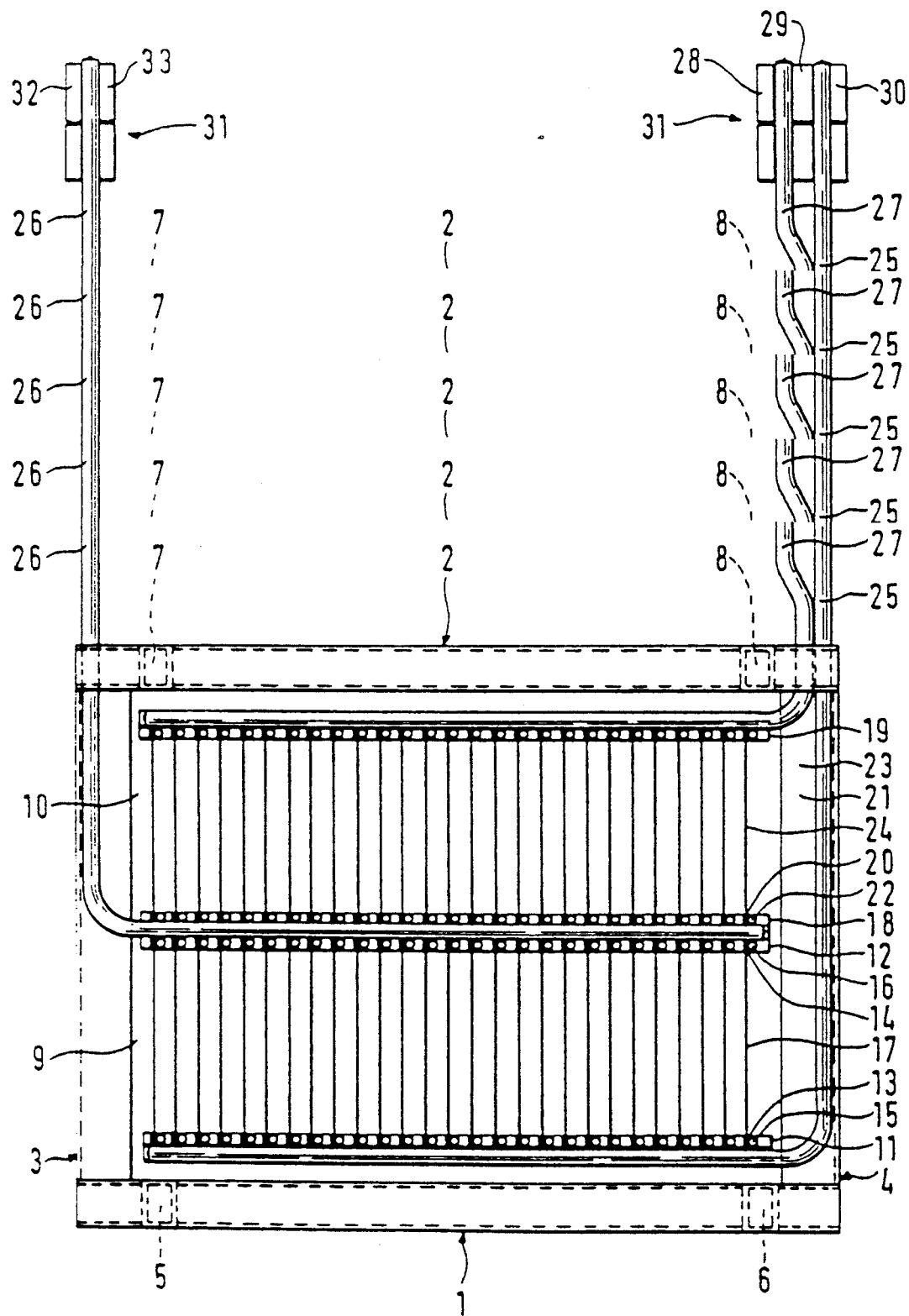
FIG. 1 is a cross-sectional front view of a rack of a first embodiment of a cooling system according to the invention.

Principally referring to FIG. 1, the rack shown therein includes a metal frame structure constituted by a plurality of interconnected frame members 1 to 8, Two like subracks 9 and 10 are secured to the rack, in a not shown but obvious way, such that some free space is left at both the lower and upper sides of these subracks.

Subrack 9 comprises two parallel guide plates 11 and 12 which extend over the width and depth of the rack, each of which has a plurality of parallel grooves, such as 13 and 14, Each of these guide plates moreover carries a plurality of pivoted excentric members such as 15 and 16, which are for instance of the type disclosed in the above mentioned PCT patent application. They are used to fix circuit boards, such as 17, in the grooves.

As also described in this patent application, the circuit board 17 is of the type having a substantially planar thermally conductive thermal sink for a plurality of electronic components mounted on the circuit board and dissipating heat, To simplify the drawing the circuit board and its thermal sink are represented by a single element 17. The longitudinal sides of each such thermal sink 17 are fixed in a pair of grooves such as 13, 14, by means of the excentric members 15, 16 which firmly press the longitudinal sides against side Malls of the grooves.

Subrack 10 likewise comprises two parallel flat guide plates 18 and 19 which extend over the width and depth of the rack. Each of these flat plates 18, 19 has a plurality of grooves, such as 20 and 21, and carries pivoted excentric members, such as 22 and 23, to fix the longitudinal sides of the thermal sink of a circuit board 24 in these grooves.

The cooling system associated with the above frame structure includes the above guide plates 11,12,18 and 19, and three L-shaped flat box-shaped heat pipes 25, 26 and 27, each with two perpendicular flat first and second portions. The first portions of the pipes 25, 26 and 27 are horizontally mounted below subrack 9, between subracks 9 and 10, and above subrack 10, respectively. The second flat portions of the pipes 25, 27 extend vertically along the frame member 4 and lead to cooling elements such as 28, 29 and 30 of a heat exchanger 31. Likewise, the second flat portion of the heat pipe 26 extends vertically along the frame member 3 and leads to other elements 32 and 33 of this heat exchanger 31. A cooling medium, e.g. water, circulates in these elements 28, 29, 30, 32, 33 of heat exchanger 31.

Figure 2:
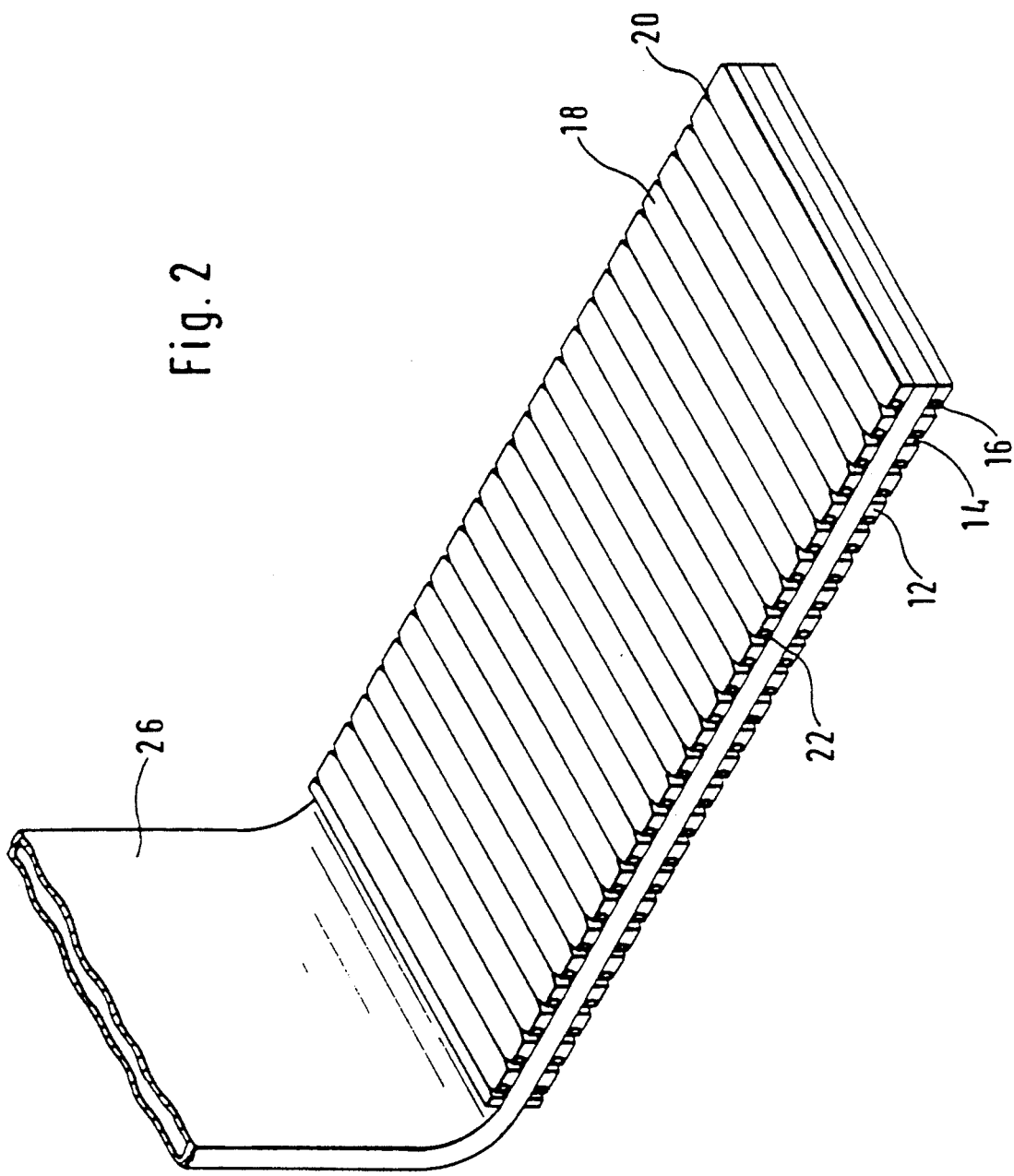
FIG. 2 is a perspective view of a part of the flat plate heat pipe 26 and associated flat guide plates 12 and 18 of FIG. 1.

Part of the flat box-shaped heat pipe 26 of FIG. 1 is shown in perspective in FIG. 2, together with the associated flat guide plates 12 and 18, of the subracks 9 and 10, respectively.

The above cooling system functions as follows: heat dissipated by components (not shown) mounted on the various circuit boards is collected by the thermal sinks , such as 17, 24, thereof, and is directly collected by the horizontal portions of the flat box-shaped heat pipes 25, 26, 27 and conveyed to the heat exchanger 31 via the vertical portions of these pipes.

Instead of being made in the guide plates, such as 11, 12, 18, 19, the grooves 13, 14, 20, 21 could also be provided directly in corresponding upper/lower walls of the box-shaped heat pipes, thus eliminating the need for using separate guide plates.

Figure 3:
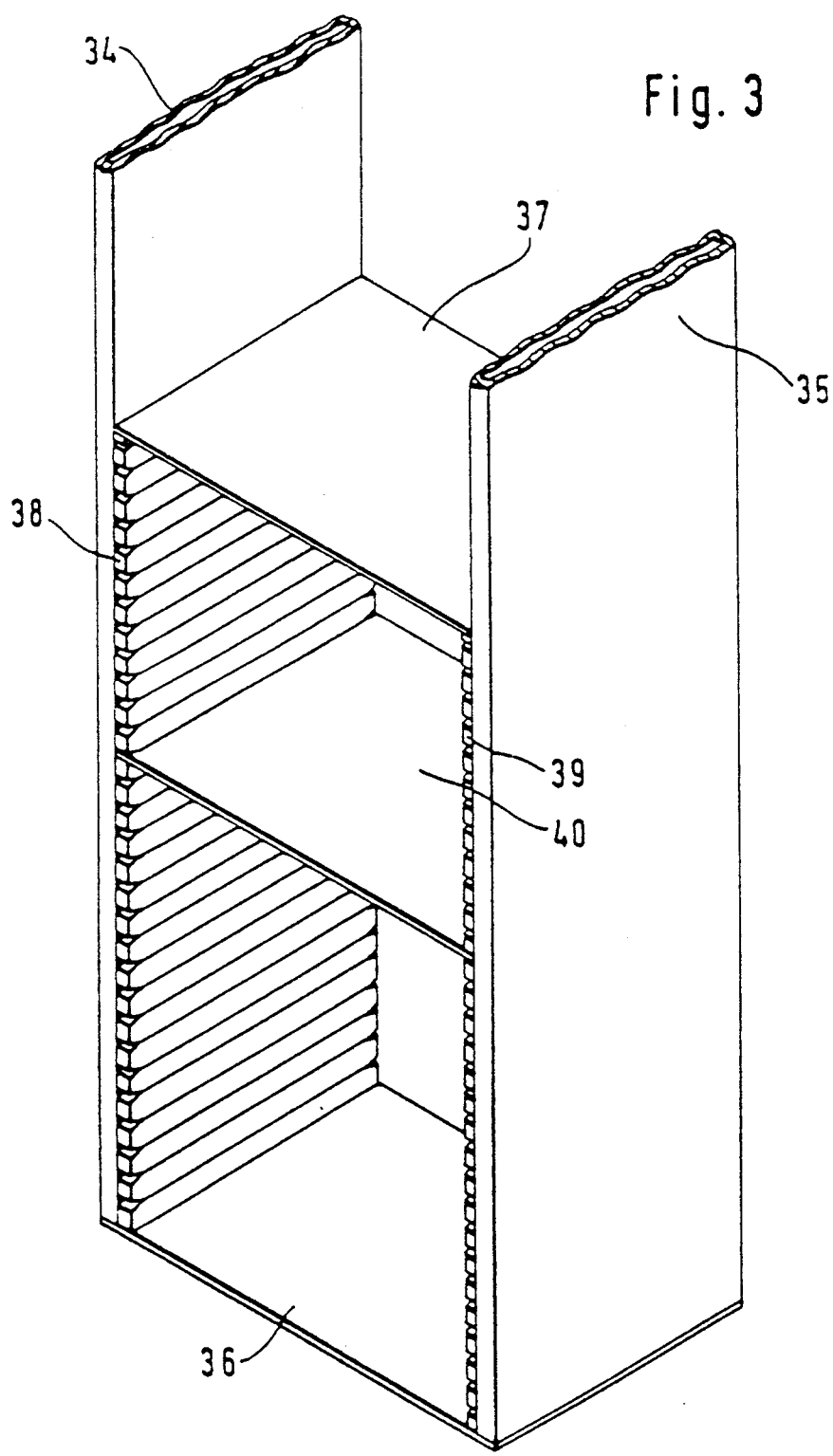
FIG. 3 is a perspective view of a second embodiment a cooling system according to the invention.

Reference is now made to FIG. 3 which schematically represents part of a cooling system to be mounted in a cabinet, or constituting a cabinet itself. It comprises a pair of vertically mounted flat box-shaped heat pipes 34 and 35 united by plates 36 and 37 to form a firm structure. The heat pipes 34 and 35 lead to a heat exchanger (not shown) and have associated grooved guide plates 38 and 39, which are of the same type as those represented in FIGS. 1 and 2. The grooves enable a printed circuit board such as 40 to be horizontally mounted such that the longitudinal sides of its thermal sink are in thermal contact with the guide plates, 38 and 39 and heat pipes 34 and 35.

While the principles of the invention have been described above in connection with specific apparatus, it is to be clearly understood that this description is made only by way of example and not as a limitation on the scope of the invention.

I claim:

1. A cooling system for a plurality of circuit boards, each circuit board having a substantially planar thermally conductive thermal sink having longitudinal sides and being in thermal contact with a plurality of electronic components dissipating heat, said cooling system including:
    a heat exchanger for delivering heat to a cooling medium; and
    a flat box-shaped heat pipe for transferring heat from thermal sinks to said heat exchanger, at least a first part of said heat pipe for thermally contacting longitudinal sides of thermal sinks of circuit boards;
    wherein grooves are provided in thermal contact with said flat box-shaped heat pipe, for receiving longitudinal sides of thermal sinks of circuit boards; and
    wherein said grooves are provided in said box-shaped heat pipe.

2. A cooling system according to claim 1, wherein said flat box-shaped heat pipe has another part substantially perpendicular to said first part and leading to said heat exchanger.

3. A cooling system according to claim 1, wherein said flat box-shaped heat pipe is disposed to be in thermal contact with longitudinal sides of thermal sinks of two adjacent sets of circuit boards.

* * * * *